(12) United States Patent
Guo et al.

(10) Patent No.: US 8,440,094 B1
(45) Date of Patent: *May 14, 2013

(54) METHOD OF POLISHING A SUBSTRATE

(75) Inventors: Yi Guo, Newark, DE (US);
Kancharla-Arun Kumar Reddy, Bear (DE)

(73) Assignee: Rohm and Haas Electronic Materials CMP Holdings, Inc., Newark, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 13/282,977

(22) Filed: Oct. 27, 2011

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC .............................................. 216/89; 438/693

(58) Field of Classification Search .................. 216/88, 216/89; 438/693
See application file for complete search history.

(56) References Cited

U.S. PATENT DOCUMENTS 7,723,234 B2 * 5/2010 Babu et al. .................... 438/693

OTHER PUBLICATIONS

U.S. Appl. No. 12/432,021.
U.S. Appl. No. 13/283,013.
Park, et al., Effect of the size and the concentration of the abrasive in a colloidal silica (SiO2) slurry with added TMAH on removal selectivity of polysilicon and oxide films in polysilicon chemical mechanical polishing, Journal of the Korean Physical Society, vol. 51, No. 1, pp. 214-223 (2007).
Veera, et al., Selective polishing of polysilicon during fabrication of microelectromechanical systems devices, Journal of the Electrochemical Society, vol. 165, No. 6, pp. H497-H494 (2009).
Yasseen, et al., Chemical-mechanical polishing for polysilicon surface micromachining, Journal of the Electrochemical Society, vol. 144, No. 1, pp. 237-242 (1997).

* cited by examiner

*Primary Examiner* — Roberts Culbert
(74) *Attorney, Agent, or Firm* — Thomas S. Deibert

(57) ABSTRACT

A process for chemical mechanical polishing of a substrate having a polysilicon overburden deposited over silicon dioxide is provided using multiple dilutions of a chemical mechanical polishing composition concentrate to polish the substrate, wherein a first dilution of the concentrate used to polish the substrate is tuned to exhibit a first polysilicon removal rate and a first polysilicon to silicon dioxide removal rate selectivity; and wherein a second dilution of the concentrate used to polish the substrate is tuned to exhibit a second polysilicon removal rate and a second polysilicon to silicon dioxide removal rate selectivity.

10 Claims, No Drawings

METHOD OF POLISHING A SUBSTRATE

The present invention relates to the field of chemical mechanical polishing. In particular, the present invention is directed to a process for chemical mechanical polishing of a substrate having a polysilicon overburden deposited over silicon dioxide using multiple dilutions of a chemical mechanical polishing composition concentrate to polish the substrate, wherein a first dilution of the concentrate used to polish the substrate is tuned to exhibit a first polysilicon removal rate and a first polysilicon to silicon dioxide removal rate selectivity; and wherein a second dilution of the concentrate used to polish the substrate is tuned to exhibit a second polysilicon removal rate and a second polysilicon to silicon dioxide removal rate selectivity.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes nonplanar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Certain recent device designs demand polishing compositions that provide selectivity for polysilicon in preference to silicon dioxide (i.e., higher removal rate for polysilicon to the removal rate for silicon dioxide) for use in chemical mechanical planarization processes. For example, such device designs include advanced, sub-65 nm integrated multilevel cell NAND flash memory devices, wherein polysilicon layers are deposited on active regions of the surface of wafers functioning as a floating gate. More particularly, certain recent designs require a two step polishing process, wherein the first step involves the removal of a polysilicon overburden down to a stop on silicon dioxide features and wherein the second step is a buff step where the polysilicon floating gate regions and the silicon dioxide feature regions on the surface of the wafer are planarized.

Conventional formulations do not provide effective stopping on the oxide film because they offer low polysilicon to oxide removal selectivity. One such polishing formulation is disclosed in U.S. Patent Application Publication No. 2007/0077865 to Dysard, et al. Dysard, et al. discloses a method of chemically mechanically polishing a substrate, which method comprises: (i) contacting a substrate comprising polysilicon and a material selected from silicon oxide and silicon nitride with a chemical mechanical polishing system comprising: (a) an abrasive, (b) a liquid carrier, (c) about 1 ppm to about 100 ppm, based on the weight of the liquid carrier and any components dissolved or suspended therein, of a polyethylene oxide/polypropylene oxide copolymer having an HLB of about 15 or less, and (d) a polishing pad, (ii) moving the polishing pad relative to the substrate, and (iii) abrading at least a portion of the substrate to polish the substrate.

Another such polishing formulation is disclosed in U.S. Pat. No. 6,626,968 to Park, et al. Park, et al. disclose a chemical mechanical polishing composition in slurry form having a pH of 7 to 11 for simultaneously polishing a surface having a silicon oxide layer and a polysilicon layer, said slurry composition consisting essentially of water, abrasive grains selected from the group consisting of silica ($SiO_2$), alumina ($Al_2O_3$), ceria ($CeO_2$), magania ($Mn_2O_3$), and mixtures thereof, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof wherein the polymer additive improves the selectivity ratio for removal of silicon oxide layer relative to removal of the polysilicon layer.

Accordingly, to support the dynamic field of device designs for use in the manufacture of semiconductor systems there exists a continued need for a chemical mechanical polishing composition formulated to provide a desirable balance of polishing properties to suit changing design needs. For example, there remains a need for chemical mechanical polishing compositions that exhibit a high polysilicon to silicon dioxide removal rate selectivity to facilitate an effective stop on silicon dioxide features.

The present invention provides a method for chemical mechanical polishing of a substrate, comprising: providing a substrate, wherein the substrate comprises a polysilicon overburden deposited over silicon dioxide; providing a chemical mechanical polishing composition concentrate, wherein the chemical mechanical polishing composition concentrate consists essentially of: water, 0.1 to 25 wt % of a colloidal silica abrasive having an average particle size of ≦100 nm; 0.01 to 1 wt % of a diquaternary cation according to formula (I):

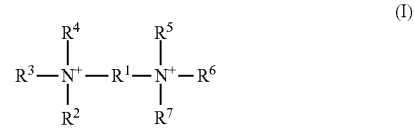

wherein $R^1$ is a $C_2$-$C_6$ alkyl group; and, wherein $R^2$, $R^3$, $R^4$, $R^5$, $R^6$ and $R^7$ are each independently selected from a $C_2$-$C_6$ alkyl group; providing a first diluent; providing a second diluent; adding the first diluent to a first portion of the chemical mechanical polishing composition concentrate to form a first polishing formulation, wherein the first polishing formulation exhibits a pH of >4.2 to 11, wherein the first polishing formulation is tuned to exhibit a first polysilicon removal rate of ≧2,000 and a first polysilicon to silicon dioxide removal rate selectivity of 20:1 to 600:1; providing a chemical mechanical polishing pad; creating dynamic contact at an interface between the chemical mechanical polishing pad and the substrate; dispensing the first polishing formulation onto the chemical mechanical polishing pad at or near the interface between the chemical mechanical polishing pad and the substrate; removing the polysilicon overburden from the substrate; adding the second diluent to a second portion of the chemical mechanical polishing composition to form a second polishing formulation, wherein the second polishing formulation exhibits a pH of 2 to 4.2, wherein the second polishing formulation is tuned to exhibit a second polysilicon removal rate of ≧1,500 Å/min and a second polysilicon to silicon dioxide removal rate selectivity of 1:2 to 10:1; dispensing the second polishing formulation onto the chemical mechanical polishing pad at or near the interface between the chemical mechanical polishing pad and the substrate; and, removing at least some more of the polysilicon and at least some of the silicon dioxide from the substrate.

The present invention provides a method for chemical mechanical polishing of a substrate, comprising: providing a substrate, wherein the substrate comprises a polysilicon overburden deposited over silicon dioxide; providing a chemical mechanical polishing composition concentrate, wherein the chemical mechanical polishing composition concentrate consists essentially of: water, 0.1 to 25 wt % of a colloidal silica abrasive having an average particle size of ≦100 nm; 0.01 to 1 wt % of a diquaternary cation according to formula (I):

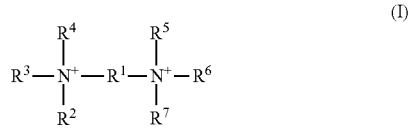

wherein $R^1$ is a $C_2$-$C_6$ alkyl group; and, wherein $R^2$, $R^3$, $R^4$, $R^5$, $R^6$ and $R^7$ are each independently selected from a $C_2$-$C_6$ alkyl group; providing a first diluent; providing a second diluent; adding the first diluent to a first portion of the chemical mechanical polishing composition concentrate to form a first polishing formulation, wherein the first polishing formulation exhibits a pH of >4.2 to 11, wherein the first polishing formulation is tuned to exhibit a first polysilicon removal rate of ≧2,000 and a first polysilicon to silicon dioxide removal rate selectivity of 20:1 to 600:1; providing a chemical mechanical polishing pad; creating dynamic contact at an interface between the chemical mechanical polishing pad and the substrate; dispensing the first polishing formulation onto the chemical mechanical polishing pad at or near the interface between the chemical mechanical polishing pad and the substrate; removing the polysilicon overburden from the substrate; adding the second diluent to a second portion of the chemical mechanical polishing composition to form a second polishing formulation, wherein the second polishing formulation exhibits a pH of 2 to 4.2, wherein the second polishing formulation is tuned to exhibit a second polysilicon removal rate of ≧1,500 Å/min and a second polysilicon to silicon dioxide removal rate selectivity of 1:2 to 10:1; dispensing the second polishing formulation onto the chemical mechanical polishing pad at or near the interface between the chemical mechanical polishing pad and the substrate; and, removing at least some more of the polysilicon and at least some of the silicon dioxide from the substrate; wherein the first polysilicon removal rate, the first polysilicon to silicon dioxide removal rate selectivity, the second polysilicon removal rate and the second polysilicon to silicon dioxide removal rate selectivity are all exhibited with a platen speed of 93 revolutions per minute, a carrier speed of 87 revolutions per minute, a chemical mechanical polishing composition flow rate of 200 ml/min, and a nominal down force of 20.7 kPa on a 200 mm polishing machine where the chemical mechanical polishing pad comprises a polyurethane polishing layer containing polymeric hollow core microparticles and a polyurethane impregnated non-woven subpad.

DETAILED DESCRIPTION

The chemical mechanical polishing concentrate used in the method of the present invention, can be diluted to provide a first dilution of the concentrate that is tuned to provide a high polysilicon removal rate and a high polysilicon to silicon dioxide removal rate selectivity for use in the first polishing step in the formation of a floating polysilicon gate feature; and then, can be diluted to provide a second dilution of the concentrate that is tuned to provide a second polysilicon to silicon dioxide removal rate selectivity for used in the second polishing step for the formation of a floating polysilicon gate feature where a non-selective slurry is desirable.

Substrate suitable for use in the chemical mechanical polishing method of the present invention comprises a semiconductor substrate having polysilicon deposited over silicon oxide.

The water contained in the chemical mechanical polishing composition concentrate used in the method of the present invention is preferably at least one of deionized and distilled to limit incidental impurities.

The colloidal silica abrasive in the chemical mechanical polishing composition concentrate used in the method of the present invention has an average particle size ≦100 nm (preferably 5 to 100 nm; more preferably 10 to 60 nm; most preferably 20 to 60 nm) as measured by dynamic light scattering techniques.

The chemical mechanical polishing composition concentrate used in the method of the present invention preferably contains 0.1 to 25 wt % (more preferably 1 to 20 wt %, still more preferably 5 to 20 wt %, most preferably 5 to 10 wt %) of a colloidal silica abrasive.

The diquaternary cation in the chemical mechanical polishing composition concentrate used in the method of the present invention is according to formula (I):

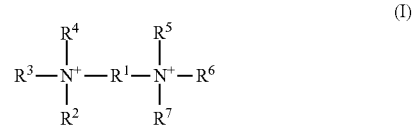

wherein $R^1$ is selected from a $C_{2-6}$ alkyl group (preferably, wherein $R^1$ is selected from a —$(CH_2)_6$— group and a —$(CH_2)_4$— group; most preferably, wherein $R^1$ is a —$(CH_2)_4$— group); and, wherein $R^2$, $R^3$, $R^4$, $R^5$, $R^6$ and $R^7$ are each independently selected from $C_{2-6}$ alkyl group (preferably, wherein $R^2$, $R^3$, $R^4$, $R^5$, $R^6$ and $R^7$ are each a butyl group). The chemical mechanical polishing composition concentrate used in the method of the present invention preferably comprises: 0.01 to 1 wt % (more preferably 0.05 to 0.5 wt %, most preferably 0.05 to 0.1 wt %) of a diquaternary substance according to formula (I). Most preferably, the chemical mechanical polishing composition concentrate used in the method of the present invention comprises 0.05 to 0.1 wt % of a diquaternary substance according to formula (I), wherein $R^1$ is a —$(CH_2)_4$— group; and, wherein $R^2$, $R^3$, $R^4$, $R^5$, $R^6$ and $R^7$ are each a —$(CH_2)_3CH_3$ group.

The chemical mechanical polishing composition concentrate used in the chemical mechanical polishing method of the present invention optionally is preferably corrosion inhibitor agent free. The term "corrosion inhibitor agent free" as used herein and in the appended claims means that the chemical mechanical polishing composition concentrate does not contain benzotriazole; 1,2,3-benzotriazole; 5,6-dimethyl-1,2,3-benzotriazole; 1-(1,2-dicarboxyethyl)benzotriazole; 1-[N,N-bis(hydroxyethyl)aminomethyl]benzotriazole; or 1-(hydroxymethyl)benzotriazole.

The chemical mechanical polishing composition concentrate used in the chemical mechanical polishing method of the present invention is preferably oxidizer free. The term "oxidizer free" as used herein and in the appended claims means that the chemical mechanical polishing composition concentrate does not contain oxidizers such as hydrogen peroxide, persulfate salts (e.g., ammonium monopersulfate, and potassium dipersulfate) and periodate salts (e.g., potassium periodate).

The first diluent used in the method of the present invention preferably comprises at least one of deionized water and distilled water. Preferably, the first diluent comprises a pH adjusting agent (preferably, wherein the pH adjusting agent is selected from ammonium hydroxide and potassium hydroxide; most preferably, potassium hydroxide) and at least one of deionized water and distilled water. More preferably, the first diluent is selected from deionized water and distilled water. Most preferably, the first diluent is deionized water.

The second diluent used in the method of the present invention preferably comprises at least one of deionized water and distilled water. The second diluent optionally further comprises a pH adjusting agent. Preferably, the second diluent is selected from deionized water or distilled water. Most preferably, the second diluent is deionized water.

Preferred pH adjusting agents include acids and bases. Preferred acid pH adjusting agents are selected from phosphoric acid, nitric acid, sulfuric acid and hydrochloric acid (most preferably, nitric acid). Preferred base pH adjusting agents are selected from ammonium hydroxide and potassium hydroxide (most preferably, potassium hydroxide).

The polishing performance parameters (i.e., polysilicon removal rate, silicon dioxide removal rate and polysilicon to silicon dioxide removal rate selectivity) of various dilutions of the chemical mechanical polishing composition concentrate used in the method of the present invention are broadly tunable over a range of polishing pH of 2 to 11. Under the polishing conditions set forth in the examples with a down force of 20.7 kPa (3 psi), dilutions of the chemical mechanical polishing composition concentrate used exhibit a tunable polysilicon removal rate of 1,500 to 7,000 Å/min; a tunable silicon dioxide removal rate of 1 to 2,500 Å/min and a tunable polysilicon to silicon dioxide removal rate selectivity of 1:2 to 600:1.

Preferably, dilutions of the chemical mechanical polishing composition concentrate used in the method of the present invention exhibit a tailorable polysilicon removal rate, as measured under the polishing conditions set forth in the Examples with a down force of 20.7 kPa (3 psi), of 1,500 to 7,000 Å/min corresponding to a chemical mechanical polishing composition concentrate pH of 2 to 11, respectively.

Preferably, the chemical mechanical polishing composition concentrate used in the method of the present invention exhibits a tailorable silicon oxide removal rate, as measured under the polishing conditions set forth in the Examples with a down force of 20.7 kPa (3 psi), of 10 to 2,500 Å/min corresponding to a chemical mechanical polishing composition concentrate pH of 2 to 11, respectively.

Preferably, the chemical mechanical polishing composition concentrate used in the method of the present invention exhibits a tailorable removal rate selectivity, as measured under the polishing conditions set forth in the Examples with a down force of 20.7 kPa (3 psi), for polysilicon to silicon oxide of 1:2 to 600:1 corresponding to a chemical mechanical polishing composition concentrate pH of 2 to 11, respectively.

The first polishing formulation used in the method of the present invention is prepared by adding a first diluent to the chemical mechanical polishing composition concentrate. Preferably, the first polishing formulation exhibits a pH of >4.2 to 11 (more preferably >6 to 11). Preferably, the first polishing formulation contains 0.01 to 6 wt % (more preferably 0.04 to 2 wt %, most preferably 0.04 to 0.6 wt %) of a colloidal silica abrasive; and, 0.0001 to 0.1 wt % (preferably 0.0004 to 0.05 wt %, more preferably 0.0005 to 0.01 wt %) of a diquaternary substance according to formula (I) (most preferably, wherein $R^1$ is a —$(CH_2)_4$— group; and, wherein $R^2$, $R^3$, $R^4$, $R^5$, $R^6$ and $R^7$ are each a —$(CH_2)_3CH_3$ group). Preferably, the first polishing formulation is tuned to exhibit a first polysilicon removal rate of $\geqq 2,000$ (more preferably 2,000 to 7,000 Å/min) and a first polysilicon to silicon dioxide removal rate selectivity of 20:1 to 600:1 (more preferably 50:1 to 600:1; most preferably 150:1 to 600:1).

The second polishing formulation used in the method of the present invention is prepared by adding a second diluent to the chemical mechanical polishing composition concentrate. Preferably, the second polishing formulation exhibits a pH of 2 to 4.2 (more preferably 3 to 4). Preferably the second polishing formulation contains 0.1 to 6 wt % (more preferably 0.4 to 6 wt %, most preferably 1 to 6 wt %) of a colloidal silica abrasive; and, 0.001 to 0.1 wt % (preferably 0.005 to 0.1 wt %, more preferably 0.01 to 0.1 wt %) of a diquaternary substance according to formula (I) (most preferably, wherein $R^1$ is a —$(CH_2)_4$— group; and, wherein $R^2$, $R^3$, $R^4$, $R^5$, $R^6$ and $R^7$ are each a —$(CH_2)_3CH_3$ group). Preferably, the second polishing formulation is tuned to exhibit a second polysilicon removal rate of $\geqq 1,500$ Å/min (more preferably 1,500 to 4,000 Å/min) and a second polysilicon to silicon dioxide removal rate selectivity of 1:2 to 10:1 (more preferably 9:10 to 5:1).

The method for chemical mechanical polishing of a substrate of the present invention, preferably comprises: providing a substrate, wherein the substrate comprises a polysilicon overburden deposited over silicon dioxide; providing a chemical mechanical polishing composition concentrate, wherein the chemical mechanical polishing composition concentrate consists essentially of: water, 0.1 to 25 wt % (preferably 1 to 20 wt %; more preferably 5 to 20 wt %; most preferably 5 to 10 wt %) of a colloidal silica abrasive having an average particle size of $\leqq 100$ nm (preferably 5 to 100 nm; more preferably 10 to 60 nm; most preferably 20 to 60 nm) as measured by dynamic light scattering techniques; 0.01 to 1 wt % (more preferably 0.05 to 0.5 wt %; most preferably 0.05 to 0.1 wt %) of a diquaternary cation according to formula (I), wherein $R^1$ is a $C_2$-$C_6$ alkyl group (preferably, wherein $R^1$ is selected from a —$(CH_2)_6$— group and a —$(CH_2)_4$— group; most preferably, wherein $R^1$ is a —$(CH_2)_4$— group); and, wherein $R^2$, $R^3$, $R^4$, $R^5$, $R^6$ and $R^7$ are each independently selected from $C_{2-6}$ alkyl group (preferably, wherein $R^2$, $R^3$, $R^4$, $R^5$, $R^6$ and $R^7$ are each a butyl group); providing a first diluent (preferably, wherein the first diluent comprises a pH adjusting agent selected from ammonium hydroxide and potassium hydroxide (preferably potassium hydroxide) and at least one of deionized water and distilled water; more preferably, wherein the first diluent is selected from deionized water and distilled water; most preferably, wherein the first diluent is deionized water); providing a second diluent (preferably, wherein the second diluent comprises at least one of deionized water and distilled water; more preferably, wherein the second diluent is selected from deionized water and distilled water; most preferably, wherein the second diluent is deionized water); adding the first diluent to a first portion of the chemical mechanical polishing composition concentrate to form a first polishing formulation, wherein the first polishing formulation exhibits a pH of >4.2 to 11 (more preferably >6 to 11), wherein the first polishing formulation is tuned to exhibit a first polysilicon removal rate of ≧2,000 Å/min (preferably 2,000 to 7,000 Å/min) and a first polysilicon to silicon dioxide removal rate selectivity of 20:1 to 600:1 (preferably 50:1 to 600:1; more preferably 150:1 to 600:1); providing a chemical mechanical polishing pad; creating dynamic contact at an interface between the chemical mechanical polishing pad and the substrate; dispensing the first polishing formulation onto the chemical mechanical polishing pad at or near the interface between the chemical mechanical polishing pad and the substrate; removing the polysilicon overburden from the substrate; adding the second diluent to a second portion of the chemical mechanical polishing composition concentrate to form a second polishing formulation, wherein the second polishing formulation exhibits a pH of 2 to 4.2 (preferably 3 to 4), wherein the second polishing formulation is tuned to exhibit a second polysilicon removal rate of ≧1,500 Å/min (preferably 1,500 to 4,000 Å/min) and a second polysilicon to silicon dioxide removal rate selectivity of 1:2 to 10:1 (more preferably 9:10 to 5:1); dispensing the second polishing formulation onto the chemical mechanical polishing pad at or near the interface between the chemical mechanical polishing pad and the substrate; and, removing at least some more of the polysilicon and at least some of the silicon dioxide from the substrate (preferably, wherein the first polysilicon removal rate, the first polysilicon to silicon dioxide removal rate selectivity, the second polysilicon removal rate and the second polysilicon to silicon dioxide removal rate selectivity are all exhibited with a platen speed of 93 revolutions per minute, a carrier speed of 87 revolutions per minute, a chemical mechanical polishing composition flow rate of 200 ml/min, and a nominal down force of 20.7 kPa on a 200 mm polishing machine where the chemical mechanical polishing pad comprises a polyurethane polishing layer containing polymeric hollow core microparticles and a polyurethane impregnated non-woven subpad).

Some embodiments of the present invention will now be described in detail in the following Examples.

EXAMPLES 1-14

Chemical Mechanical Polishing Composition Preparation

The chemical mechanical polishing compositions of Examples 1 and 14 were prepared by combining the components in the amounts listed in TABLE 1 with the balance being deionized water and adjusting the pH of the compositions to the final pH listed in TABLE 1 with nitric acid or potassium hydroxide. The chemical mechanical polishing compositions of Examples 2-13 were prepared by diluting with deionized water the chemical mechanical polishing composition of Example 1.

TABLE 1

| Ex # | Abrasive I* (wt %) | Abrasive III£ (wt %) | Compound formula (I) (wt %)ᵉ | pH |
|---|---|---|---|---|
| 1 | 5 | 1 | 0.075 | 3.0 |
| 2 | 0.5 | 0.1 | 0.0075 | 3.9 |
| 3 | 0.83 | 0.17 | 0.0125 | 3.5 |
| 4 | 1.67 | 0.33 | 0.025 | 3.4 |
| 5 | 1.67 | 0.33 | 0.025 | 7 |
| 6 | 0.5 | 0.1 | 0.0075 | 10.8 |
| 7 | 0.83 | 0.17 | 0.0125 | 10.8 |
| 8 | 1.67 | 0.33 | 0.025 | 10.8 |
| 9 | 0.33 | 0.07 | 0.005 | 4.07 |
| 10 | 0.167 | 0.033 | 0.0025 | 4.19 |
| 11 | 0.083 | 0.017 | 0.00125 | 4.31 |
| 12 | 0.0583 | 0.0117 | 0.000875 | 4.35 |
| 13 | 0.033 | 0.007 | 0.0005 | 4.75 |
| 14 | 20 | 4 | 0.3 | 2.4 |

*Abrasive I—Klebosol™ II 1598-B25 slurry manufactured by AZ Electronic Materials, available from The Dow Chemical Company.
£Abrasive II—Klebosol™ 30H50i slurry manufactured by AZ Electronic Materials, available from The Dow Chemical Company.
ᵉHBBAH: 1,4-butanediaminium, $N^1,N^1,N^1,N^4,N^4,N^4$-hexabutyl-hydroxide (1:2) from Sachem, Inc., having the following structure:

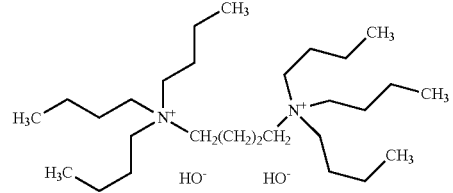

Examples PA1-PA13

Chemical Mechanical Polishing Removal Rate Experiments

Polysilicon and silicon dioxide removal rate polishing tests were performed using the chemical mechanical polishing compositions prepared according to Examples 1-13. Specifically, the polysilicon and silicon dioxide removal rate for each of the chemical mechanical polishing compositions 1-13 as identified in TABLE 1. The polishing removal rate experiments were performed on 200 mm blanket wafers (i.e., 8 k polysilicon sheet wafers; and 1 k TEOS sheet wafers from SEMATECH SVTC). An Applied Materials 200 mm Mirra® polisher was used. All polishing experiments were performed using an IC1010™ polyurethane polishing pad (commercially available from Rohm and Haas Electronic Materials CMP Inc.) with a down force of 20.7 kPa (3 psi), a chemical mechanical polishing slurry composition flow rate of 200 ml/min, a table rotation speed of 93 rpm and a carrier rotation speed of 87 rpm. A Diagrid® AD3BG-150855 diamond pad conditioner (commercially available from Kinik Company) was used to condition the polishing pad. The polishing pad was broken in with the conditioner using a down force of 14.0 lbs (6.35 kg) for 20 minutes. The polishing pad was further conditioned ex situ prior to polishing using a down force of 9 lbs (4.1 kg) for 10 minutes. The polishing pad was further conditioned in situ during polishing at 10 sweeps/min from 1.7 to 9.2 in from the center of the polishing pad with a down force of 9 lbs (4.1 kg). The removal rates were determined by measuring the film thickness before and after polishing using a KLA-Tencor FX200 metrology tool using a 49 point spiral scan with a 3 mm edge exclusion. The results of the removal rate experiments are provided in TABLE 2.

TABLE 2

| Ex # | Slurry Composition | Polysilicon removal rate (Å/min) | SiO$_2$ removal rate (Å/min) | Polysilicon to SiO$_2$ removal rate selectivity |
|---|---|---|---|---|
| PA1 | Ex. 1 | 2200 | 2150 | 1:1 |
| PA2 | Ex. 2 | 2616 | 548 | 4.8:1 |
| PA3 | Ex. 3 | 2050 | 850 | 2.4:1 |
| PA4 | Ex. 4 | 1850 | 1450 | 1.3:1 |
| PA5 | Ex. 5 | 3600 | 70 | 51:1 |
| PA6 | Ex. 6 | 3900 | 15 | 260:1 |
| PA7 | Ex. 7 | 4100 | 15 | 273:1 |
| PA8 | Ex. 8 | 4300 | 20 | 215:1 |
| PA9 | Ex. 9 | 2781 | 322 | 8.6:1 |
| PA10 | Ex. 10 | 2817 | 98 | 28.7:1 |
| PA11 | Ex. 11 | 2535 | 15 | 169:1 |
| PA12 | Ex. 12 | 2516 | 12 | 210:1 |
| PA13 | Ex. 13 | 2392 | 4 | 598:1 |

Examples PB1-PB13

Chemical Mechanical Polishing Removal Rate Experiments

Polysilicon and silicon dioxide removal rate polishing tests were performed using the chemical mechanical polishing compositions prepared according to Examples 1-13. Specifically, the polysilicon and silicon dioxide removal rate for each of the chemical mechanical polishing compositions 1-13 as identified in TABLE 1. The polishing removal rate experiments were performed on 200 mm blanket wafers (i.e., 8 k polysilicon sheet wafers; and 1 k TEOS sheet wafers from SEMATECH SVTC). An Applied Materials 200 mm Mirra® polisher was used. All polishing experiments were performed using an IC1010™ polyurethane polishing pad (commercially available from Rohm and Haas Electronic Materials CMP Inc.) with a down force of 34.5 kPa (5 psi), a chemical mechanical polishing slurry composition flow rate of 200 ml/min, a table rotation speed of 93 rpm and a carrier rotation speed of 87 rpm. A Diagrid® AD3BG-150855 diamond pad conditioner (commercially available from Kinik Company) was used to condition the polishing pad. The polishing pad was broken in with the conditioner using a down force of 14.0 lbs (6.35 kg) for 20 minutes. The polishing pad was further conditioned ex situ prior to polishing using a down force of 9 lbs (4.1 kg) for 10 minutes. The polishing pad was further conditioned in situ during polishing at 10 sweeps/min from 1.7 to 9.2 in from the center of the polishing pad with a down force of 9 lbs (4.1 kg). The removal rates were determined by measuring the film thickness before and after polishing using a KLA-Tencor FX200 metrology tool using a 49 point spiral scan with a 3 mm edge exclusion. The results of the removal rate experiments are provided in TABLE 3.

TABLE 3

| Ex # | Slurry Composition | Polysilicon removal rate (Å/min) | SiO$_2$ removal rate (Å/min) | Polysilicon to SiO$_2$ removal rate selectivity |
|---|---|---|---|---|
| PB1 | Ex. 1 | 2430 | 3370 | 0.7:1 |
| PB2 | Ex. 2 | 3856 | 700 | 5.5:1 |
| PB3 | Ex. 3 | 3250 | 1100 | 3:1 |
| PB4 | Ex. 4 | 2650 | 1900 | 1.4:1 |
| PB5 | Ex. 5 | 5500 | 80 | 68.8:1 |
| PB6 | Ex. 6 | 6100 | 25 | 244:1 |
| PB7 | Ex. 7 | 6400 | 25 | 256:1 |
| PB8 | Ex. 8 | 6500 | 30 | 217:1 |
| PB9 | Ex. 9 | 4057 | 409 | 9.9:1 |
| PB10 | Ex. 10 | 4050 | 119 | 34:1 |
| PB11 | Ex. 11 | 3494 | 22 | 159:1 |
| PB12 | Ex. 12 | 3516 | 20 | 176:1 |
| PB13 | Ex. 13 | 3075 | 10 | 308:1 |

We claim:

1. A method for chemical mechanical polishing of a substrate, comprising:

providing a substrate, wherein the substrate comprises a polysilicon overburden deposited over silicon dioxide;

providing a chemical mechanical polishing composition concentrate, wherein the chemical mechanical polishing composition concentrate consists essentially of:

water, 0.1 to 25 wt % of a colloidal silica abrasive having an average particle size of $\leq 100$ nm;

0.01 to 1 wt % of a diquaternary cation according to formula (I):

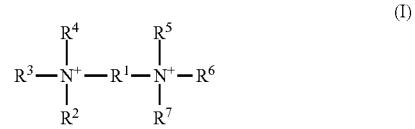

wherein $R^1$ is a $C_2$-$C_6$ alkyl group; and, wherein $R^2$, $R^3$, $R^4$, $R^5$, $R^6$ and $R^7$ are each independently selected from a $C_2$-$C_6$ alkyl group;

providing a first diluent;

providing a second diluent;

adding the first diluent to a first portion of the chemical mechanical polishing composition concentrate to form a first polishing formulation, wherein the first polishing formulation exhibits a pH of >4.2 to 11, wherein the first polishing formulation is tuned to exhibit a first polysilicon removal rate of $\geq 2,000$ Å/min and a first polysilicon to silicon dioxide removal rate selectivity of 20:1 to 600:1;

providing a chemical mechanical polishing pad;

creating dynamic contact at an interface between the chemical mechanical polishing pad and the substrate;

dispensing the first polishing formulation onto the chemical mechanical polishing pad at or near the interface between the chemical mechanical polishing pad and the substrate;

removing the polysilicon overburden from the substrate;

adding the second diluent to a second portion of the chemical mechanical polishing composition concentrate to form a second polishing formulation, wherein the second polishing formulation exhibits a pH of 2 to 4.2, wherein the second polishing formulation is tuned to exhibit a second polysilicon removal rate of $\geq 1,500$ Å/min and a second polysilicon to silicon dioxide removal rate selectivity of 1:2 to 10:1;

dispensing the second polishing formulation onto the chemical mechanical polishing pad at or near the interface between the chemical mechanical polishing pad and the substrate; and, removing at least some more of the polysilicon and at least some of the silicon dioxide from the substrate.

2. The method of claim 1, wherein the first diluent and the second diluent are deionized water.

3. The method of claim 1, wherein the first diluent is a combination of deionized water and a pH adjusting agent.

4. The method of claim 1, wherein the chemical mechanical polishing composition is corrosion inhibitor free and oxidizer free.

5. The method of claim 1, wherein $R^1$ is a $C_4$ alkyl group; and, wherein $R^2$, $R^3$, $R^4$, $R^5$, $R^6$ and $R^7$ are each a $C_4$ alkyl group.

6. The method of claim 5, wherein the chemical mechanical polishing composition is corrosion inhibitor free.

7. The method of claim 5, wherein the chemical mechanical polishing composition is oxidizer free.

8. The method of claim 5, wherein the chemical mechanical polishing composition is corrosion inhibitor free and oxidizer free.

9. The method of claim 1, wherein the pH of the chemical mechanical polishing composition is adjusted through addition of deionized water.

10. The method of claim 1, wherein the first polysilicon removal rate, the first polysilicon to silicon dioxide removal rate selectivity, the second polysilicon removal rate and the second polysilicon to silicon dioxide removal rate selectivity are all exhibited with a platen speed of 93 revolutions per minute, a carrier speed of 87 revolutions per minute, a chemical mechanical polishing composition flow rate of 200 ml/min, and a nominal down force of 20.7 kPa on a 200 mm polishing machine where the chemical mechanical polishing pad comprises a polyurethane polishing layer containing polymeric hollow core microparticles and a polyurethane impregnated non-woven subpad.

* * * * *